United States Patent [19]

Locascio

[11] Patent Number: 4,964,026
[45] Date of Patent: Oct. 16, 1990

[54] NOISE REDUCTION TECHNIQUE FOR PWM CONTROLLERS

[75] Inventor: James J. Locascio, San Jose, Calif.

[73] Assignee: Micro Linear Corporation, San Jose, Calif.

[21] Appl. No.: 406,776

[22] Filed: Sep. 13, 1989

[51] Int. Cl.$^5$ ............................................. H02M 3/335
[52] U.S. Cl. ........................................ 363/39; 363/41
[58] Field of Search ................. 363/20, 21, 39, 41, 363/95, 97

[56] References Cited

U.S. PATENT DOCUMENTS

| | | | |
|---|---|---|---|
| 4,672,300 | 6/1987 | Harper | 363/97 |
| 4,737,853 | 4/1988 | Graves et al. | 363/21 |
| 4,755,922 | 7/1988 | Puvogel | 363/21 |
| 4,791,546 | 12/1988 | Carroll | 363/95 |
| 4,794,508 | 12/1988 | Carroll | 363/41 |

*Primary Examiner*—Peter S. Wong
*Attorney, Agent, or Firm*—Limbach, Limbach & Sutton

[57] ABSTRACT

The present invention is for an architecture for an input circuit to a linear circuit having a circuit ground from a linear system having a system ground. The architecture has a linear input signal which is coupled into a current limiting input impedance. The current limiting input impedance is not connected to the system ground. A linear input circuit is coupled to receive the reduced input signal and is coupled to the circuit ground. Accordingly, the analog input to the linear input circuit is a current signal rather than a voltage signal.

4 Claims, 1 Drawing Sheet

NOISE REDUCTION TECHNIQUE FOR PWM CONTROLLERS

FIELD OF THE INVENTION

This invention relates to the field of noise reduction techniques for linear circuits. More particularly, this invention relates to the architecture of an input circuit for a linear integrated circuit.

BACKGROUND OF THE INVENTION

Prior art input architectures for a linear circuit ordinarily comprise a resistor voltage divider network to transform the voltage to a level upon which the circuit can operate. Supply power is corrected and controlled through the use of the power factor controller such as shown in prior art FIG. 1. The value of line voltage is reduced to a level which will not damage the integrated circuit IC through a resistor voltage divider network. In the circuit of FIG. 1, the rectified line voltage of 127 to 380 volts peak is coupled to the IC through the resistor divider network which comprises a 650K ohms resistor R1 connected between the rectified line voltage and to the input pin and a 2K ohm resistor R2 connected between the input pin and the system ground 10. The input signal to the IC is a voltage. The input circuit in the IC is a circuit for receiving a voltage signal. A voltage buffer 18 is coupled to the IC input pin 12 to receive the voltage signal. The buffer 18 is in series with a current limiting resistor 20. The resistor 20 is also coupled to the anode of a diode D1 and to the base of a bipolar NPN transistor T1. The diode D1 is coupled in parallel with the base and emitter circuit of the transistor T1. The cathode of the diode D1 and the emitter of the transistor T1 are connected to the IC ground 16. The IC ground 16 is connected through the IC ground pin 14 to the system ground 10.

Any noise introduced between the IC ground pin 14 and the system ground 10 causes fluctuations on the internal ground bus 16 of the IC. Such fluctuations in the IC ground bus 16 deleteriously effects the ability of the power factor controller to accurately control the power.

For typical power systems, the voltage range is 127 to 380 volts peak or approximately 90 to 270 VAC. The input voltage range to the integrated circuit is about 0.4 to 1.2 volts. Thus, 20 mV of noise in the system ground is a significant portion of the input voltage, i.e. from approximately 5% to 1.6%. A circuit is needed which reduces the effect on the operation a linear IC of noise in the system ground.

SUMMARY OF THE INVENTION

The present invention is for an architecture for an input circuit to a linear circuit having a circuit ground from a linear system having a system ground. The architecture has a linear input signal which is coupled into a current limiting input impedance. The current limiting input impedance is not connected to the system ground. A linear input circuit is coupled to receive the reduced input signal and is coupled to the circuit ground. Accordingly, the analog input to the linear input circuit is a current signal rather than a voltage signal. A noise source of 20mV between the system ground and IC ground will result in a current change to the IC of 20mV/peak voltage, i.e. approximately 0.0078% for 127VAC and 0.0052% for 380 VAC. Thus, the input signal is approximately independent of ground noise.

DETAILED DESCRIPTION OF THE PREFERRED EMBODIMENT

The present invention is an input architecture for a linear circuit. The architecture reduces the effect of a noise coupled between an external and internal ground. This improvement is achieved by utilizing a current input. In contrast, traditional linear circuits utilize a voltage input which is scaled by a voltage divider network.

An analog signal is applied to the input of an analog circuit. The input is a current input. A current limiting impedance is placed in series with the current input to reduce the value of the current signal to a level which can be handled by the circuit.

Figure 1:
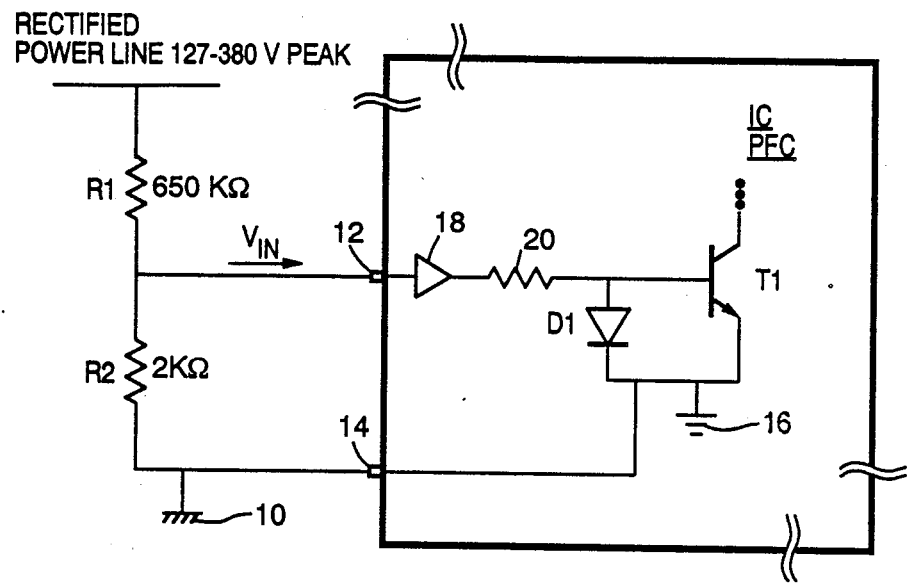
FIG. 1 shows a prior art input circuit to a linear integrated circuit.
Figure 2:
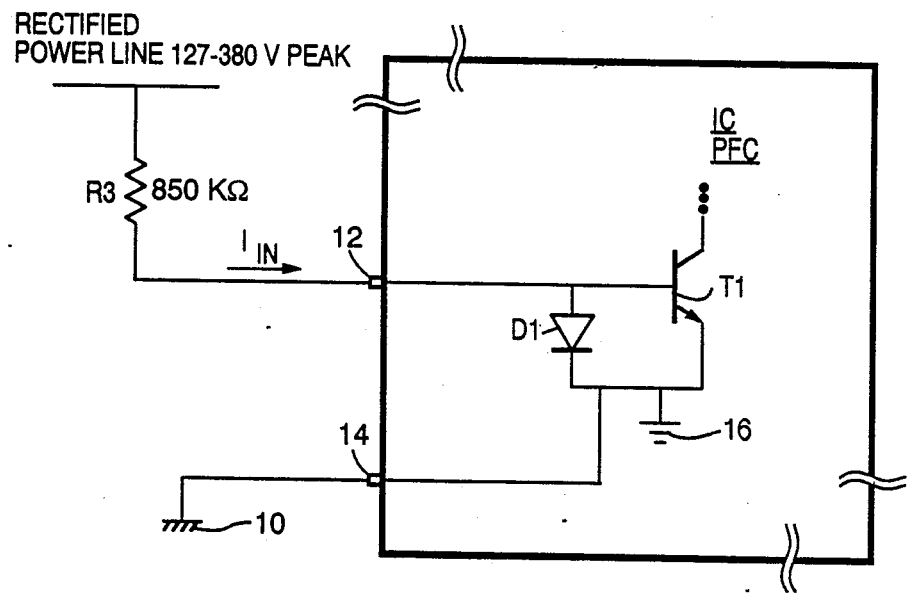
FIG. 2 shows an input circuit to a linear integrated circuit according to the present invention.

The circuit of the preferred embodiment shown in FIG. 2, is a power factor controller IC PFC. The power factor controller of the preferred embodiment is the Micro Linear ML 4812. (Micro Linear is a trademark of Micro Linear Corporation). This circuit and applications are described in a data sheet published by Micro Linear in June 1989, and is available by calling (408) 433-5200. The circuit is also described in the May 1989 proceedings of the High Frequency Power Conversion conference at Naples, Florida.

The circuit has an analog input pin 12. The anode of an input diode D1 and the base of an NPN transistor T1 are connected to the input pin 12. The cathode of the diode D1 and the emitter of the transistor T1 are connected to the internal integrated circuit ground 16. The internal ground 16 is coupled to the system ground 10 through the integrated circuit pin 14.

The circuit of the preferred embodiment is intended to operate for standard AC power in the range of 90-270 VAC. Thus, a power factor controller using this input architecture is ideally suited to be used in the United States or in Europe. An 820 Ohm resistor R3 is coupled in series between a rectified power line signal and the input pin 12 of the integrated circuit. The input signal $I_{IN}$ is not coupled to either the system ground 10 or IC ground 16. Thus, the effect of noise on the analog signal line is significantly reduced.

What is claimed is:

1. A linear circuit architecture comprising:
   a. a first linear circuit having a first ground;
   b. a current limiting input impedance coupled in series to receive a linear signal from the first linear circuit for forming a reduced linear signal and further wherein the current limiting input impedance is a resistor which is not connected to the first ground; and
   c. a second linear circuit having a second ground and an input circuit coupled to receive the reduced linear signal from the current limiting impedance.

2. The linear circuit architecture according to claim 1 wherein the input circuit comprises a diode having an anode and an NPN transistor having a base coupled to the current limiting impedance and the diode cathode and transistor emitter coupled to the second ground.

3. A linear circuit architecture comprising:

a. a first linear circuit having a first ground;
b. a current limiting input impedance coupled in series to receive a linear signal from the first linear circuit for forming a reduced linear signal wherein the linear signal is a current signal; and
c. a second linear circuit having a second ground and an input circuit coupled to receive the reduced linear signal from the current limiting impedance.

4. A linear circuit architecture comprising:
a. a first linear circuit having a first ground;
b. a current limiting input impedance coupled in series to receive a linear signal from the first linear circuit for forming a reduced linear signal wherein the reduced linear signal is approximately independent of noise in the first ground or the second ground; and
c. a second linear circuit having a second ground and an input circuit coupled to receive the reduced linear signal from the current limiting impedance.

* * * * *